(12) United States Patent
Cho

(10) Patent No.: US 11,538,841 B2
(45) Date of Patent: Dec. 27, 2022

(54) IMAGE SENSING DEVICE

(71) Applicant: SK hynix Inc., Icheon-si (KR)

(72) Inventor: Min Su Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 183 days.

(21) Appl. No.: 16/941,195

(22) Filed: Jul. 28, 2020

(65) Prior Publication Data

US 2021/0242263 A1 Aug. 5, 2021

(30) Foreign Application Priority Data

Feb. 4, 2020 (KR) ........................ 10-2020-0013091

(51) Int. Cl.
*H01L 27/146* (2006.01)
(52) U.S. Cl.
CPC .. *H01L 27/14627* (2013.01); *H01L 27/14603* (2013.01); *H01L 27/14636* (2013.01)
(58) Field of Classification Search
CPC ......... H01L 27/14627; H01L 27/14603; H01L 27/14636; H01L 27/14621; H01L 27/14625; H01L 27/1462; G02B 5/3058; G02B 5/30
See application file for complete search history.

(56) References Cited

U.S. PATENT DOCUMENTS

2019/0148437 A1* 5/2019 Cheng .................. G02B 5/201
257/432

FOREIGN PATENT DOCUMENTS

KR 10-2010-0122058 A 11/2010
KR 10-2020-0082333 A 7/2020

* cited by examiner

*Primary Examiner* — Tucker J Wright
(74) *Attorney, Agent, or Firm* — Perkins Coie LLP

(57) ABSTRACT

An image sensing device is provided to include a semiconductor substrate configured to include a photoelectric conversion element that generates photocharges in response to light incident to the photoelectric conversion element, a plurality of microlenses disposed over the semiconductor substrate and configured to allow the incident light to converge upon the photoelectric conversion element, and a polarization structure disposed between the semiconductor substrate and the microlenses and configured to transmit light of a polarization oriented in a specific direction to the photoelectric conversion element, wherein the polarization structure includes one or more air layers.

18 Claims, 6 Drawing Sheets

IMAGE SENSING DEVICE

CROSS-REFERENCE TO RELATED APPLICATION

This patent document claims the priority and benefits of Korean patent application No. 10-2020-0013091, filed on Feb. 4, 2020, which is incorporated by reference in its entirety as part of the disclosure of this patent document.

TECHNICAL FIELD

The technology and implementations disclosed in this patent document generally relate to an image sensing device.

BACKGROUND

An image sensor is a device for converting an optical image into electrical signals. Recently, with the increasing development of computer industries and communication industries, demand for high-quality and high-performance image sensors has been rapidly increasing in various electronic devices, for example, digital cameras, camcorders, personal communication systems (PCSs), video game consoles, surveillance cameras, medical micro-cameras, robots, etc.

In order to acquire a three-dimensional (3D) image using the image sensor, color information of the 3D image and the distance (or depth) between a target object and the image sensor are needed.

A method for acquiring information about the distance between the target object and the image sensor may be classified into a passive method and an active method.

The passive method may calculate the distance between the target object and the image sensor using only image information of the target object without emitting light to the target object. The passive method can be applied to a stereo camera.

The active method may be classified into a triangulation method, a Time of Flight (TOF) method, etc. After light has been emitted from a light source (e.g., a laser source) spaced apart from the image sensor by a predetermined distance, the triangulation method may sense light reflected from a target object, and may calculate the distance between the target object and the image sensor using the sensing result. After light has been emitted from the light source to the target object, the TOF method may measure a time duration in which light is reflected from the target object and returns to the image sensor, such that the TOF method may calculate the distance between the target object and the image sensor using the measurement result.

SUMMARY

Various embodiments of the disclosed technology relate to an image sensing device capable of minimizing noises caused by external light.

In one aspect, an image sensing device is provided to include a semiconductor substrate including a first surface and a second surface facing the first surface, and configured to include a photoelectric conversion element that generates photocharges by performing photoelectric conversion of light incident upon the first surface; a plurality of microlenses disposed over the first surface of the semiconductor substrate, and configured to allow the incident light to converge upon the corresponding photoelectric conversion element; and a polarization element disposed between the semiconductor substrate and the microlenses, and configured to allow specific light having polarization components oriented in a specific direction from among the incident light to selectively pass therethrough, wherein the polarization element includes one or more air layers.

In another aspect, an image sensing device is provided to include a semiconductor substrate configured to include a photoelectric conversion element that generates photocharges in response to light incident to the photoelectric conversion element, a plurality of microlenses disposed over the semiconductor substrate and configured to allow the incident light to converge upon the photoelectric conversion element, and a polarization structure disposed between the semiconductor substrate and the microlenses and configured to transmit light of a polarization oriented in a specific direction to the photoelectric conversion element, wherein the polarization structure may include one or more air layers.

In another aspect, an image sensing device is provided to include a pixel array in which a plurality of unit pixels configured to output a pixel signal by performing photoelectric conversion of incident light is consecutively arranged not only in a first direction but also in a second direction perpendicular to the first direction, wherein the pixel array includes: a photoelectric conversion element configured to perform photoelectric conversion of the incident light; and a polarization element disposed over the photoelectric conversion element, and configured to allow specific light having polarization components oriented in a specific direction from among the incident light to selectively pass through the photoelectric conversion element, wherein the polarization element includes one or more air layers.

In another aspect, an image sensing device is provided to include a pixel array in which a plurality of unit pixels are arranged in a first direction and a second direction perpendicular to the first direction and configured to output a pixel signal corresponding to photocharges generated in response to incident light. The pixel array may include a photoelectric conversion element configured to generate the photocharges in response to the incident light, and a polarization structure disposed over the photoelectric conversion element, and configured to transmit a polarized light oriented in a specific direction among the incident light to the photoelectric conversion element. The polarization structure includes one or more air layers.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device that can minimize noises caused by external light.

Reference will now be made in detail to certain embodiments, examples of which are illustrated in the accompanying drawings. In general, the same reference numbers will be used throughout the drawings to refer to the same or similar parts. In the following description, a detailed description of related known configurations or functions incorporated herein will be omitted to avoid obscuring the subject matter.

Figure 1:
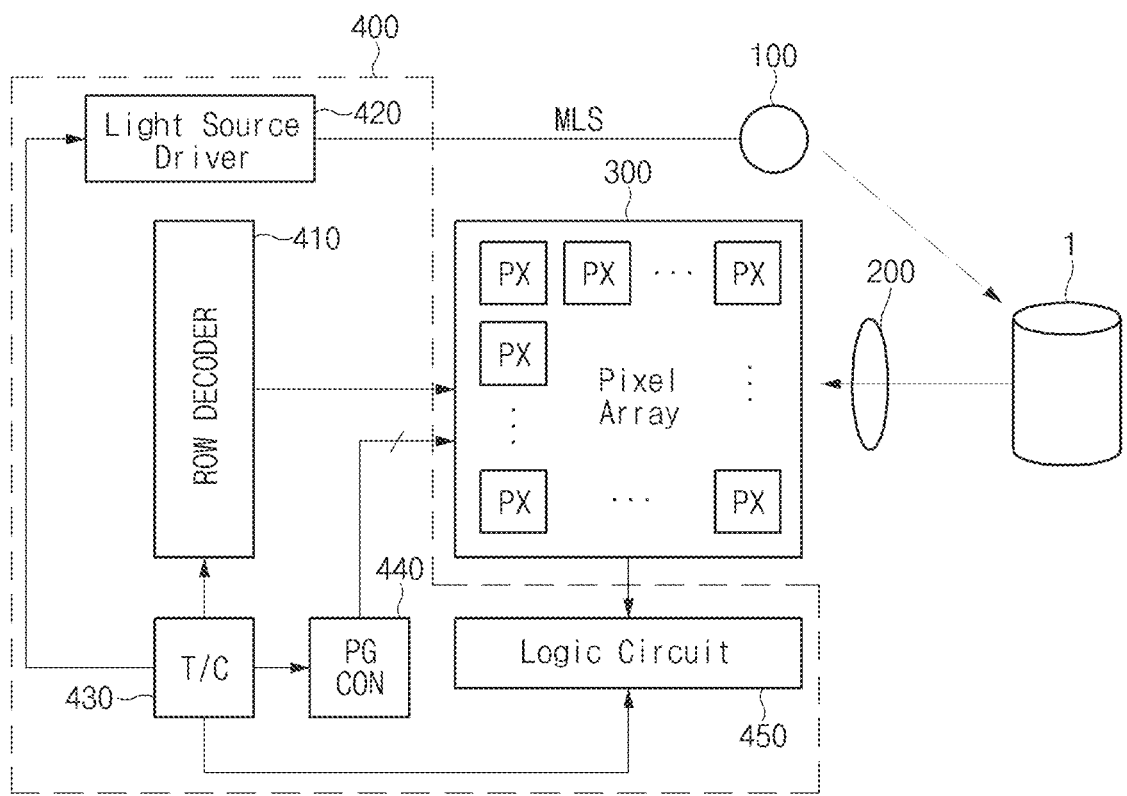
FIG. 1 is a block diagram illustrating an example of an image sensing device based on some implementations of the disclosed technology.

FIG. 1 is a block diagram illustrating an example of an image sensing device based on some implementations of the disclosed technology.

Referring to FIG. 1, the image sensing device may measure the distance using the Time of Flight (TOF) technique. The image sensing device may include a light source 100, a lens module 200, a pixel array 300, and a control circuit 400.

The light source 100 may emit light to a target object 1 upon receiving a clock signal MLS (modulated light signal) from the control circuit 400. The light source 100 may be a laser diode (LD) or a light emitting diode (LED) for emitting infrared light or visible light, or may be any one of a Near Infrared Laser (NIR), a point light source, a monochromatic light source combined with a white lamp or a monochromator, and a combination of other laser sources. For example, the light source 100 may emit infrared light having a wavelength of 800 nm to 1000 nm. Although FIG. 1 shows only one light source 100 for convenience of description, the scope or spirit of the disclosed technology is not limited thereto, and a plurality of light sources may also be arranged in the vicinity of the lens module 200.

The lens module 200 may collect light reflected from the target object 1, and may allow the collected light to be focused onto pixels (PXs) of the pixel array 300. The lens module 200 may include a focusing lens having a surface formed of or including glass or plastic, or other cylindrical optical elements. The lens module 200 may include a focusing lens having a convex structure.

The pixel array 300 may include unit pixels (PXs) consecutively arranged in a two-dimensional (2D) structure in which unit pixels are arranged in a column direction and a row direction perpendicular to the column direction. The unit pixels (PXs) may convert light received through the lens module 200 into an electrical signal corresponding to the received light such that each unit pixel can output a pixel signal. In this case, the pixel signal may be a signal for indicating the distance to the target object 1, instead of indicating a signal indicating a color of the target object 1. The pixel array 300 may include a polarization structure disposed between the lens layer and a photoelectric conversion element. In some implementations, the polarization structure may be structured to include air therein. Each unit pixel (PX) may be structured in various suitable pixel configurations and may include, for example, a Current-Assisted Photonic Demodulator (CAPD) pixel for detecting electrons generated in a semiconductor substrate by incident light using a difference between potential levels of an electric field.

The control circuit 400 may control the light source 100 to emit light to the target object 1, may process each pixel signal corresponding to light reflected from the target object 1 by driving unit pixels (PXs) of the pixel array 300, and may measure the distance to the surface of the target object 1.

The control circuit 400 may include a row decoder 410, a light source driver 420, a timing controller 430, a photogate controller 440, and a logic circuit 450.

The row decoder 410 may drive unit pixels (PXs) of the pixel array 300 in response to a timing signal generated from the timing controller 430. For example, the row decoder 410 may generate a control signal capable of selecting at least one of the plurality of row lines.

The light source driver 420 may generate a clock signal MLS capable of driving the light source 100 in response to a control signal from the timing controller 430. The light source driver 420 may supply either the clock signal MLS or information about the clock signal MLS to the photogate controller 440.

The timing controller 430 may generate a timing signal to control the row decoder 410, the light source driver 420, the photogate controller 440, and the logic circuit 450.

The photogate controller 440 may generate photogate control signals in response to a control signal of the timing controller 430, and may supply the photogate control signals to the pixel array 300. Although FIG. 1 illustrates only the photogate controller 440 for convenience of description, the control circuit 400 may include a photodiode controller that generates a plurality of photodiode control signals in response to a control signal of the timing controller 430 and then transmits the photodiode control signals to the pixel array 300.

The logic circuit 450 may process pixel signals received from the pixel array 300 under control of the timing controller 430, and may thus calculate the distance to the target object 1. The logic circuit 450 may include a correlated double sampler (CDS) for performing correlated double sampling on the pixel signals generated from the pixel array 300. In addition, the logic circuit 450 may include an analog-to-digital converter (ADC) for converting output signals of the correlated double sampler (CDS) into digital signals.

Figure 2:
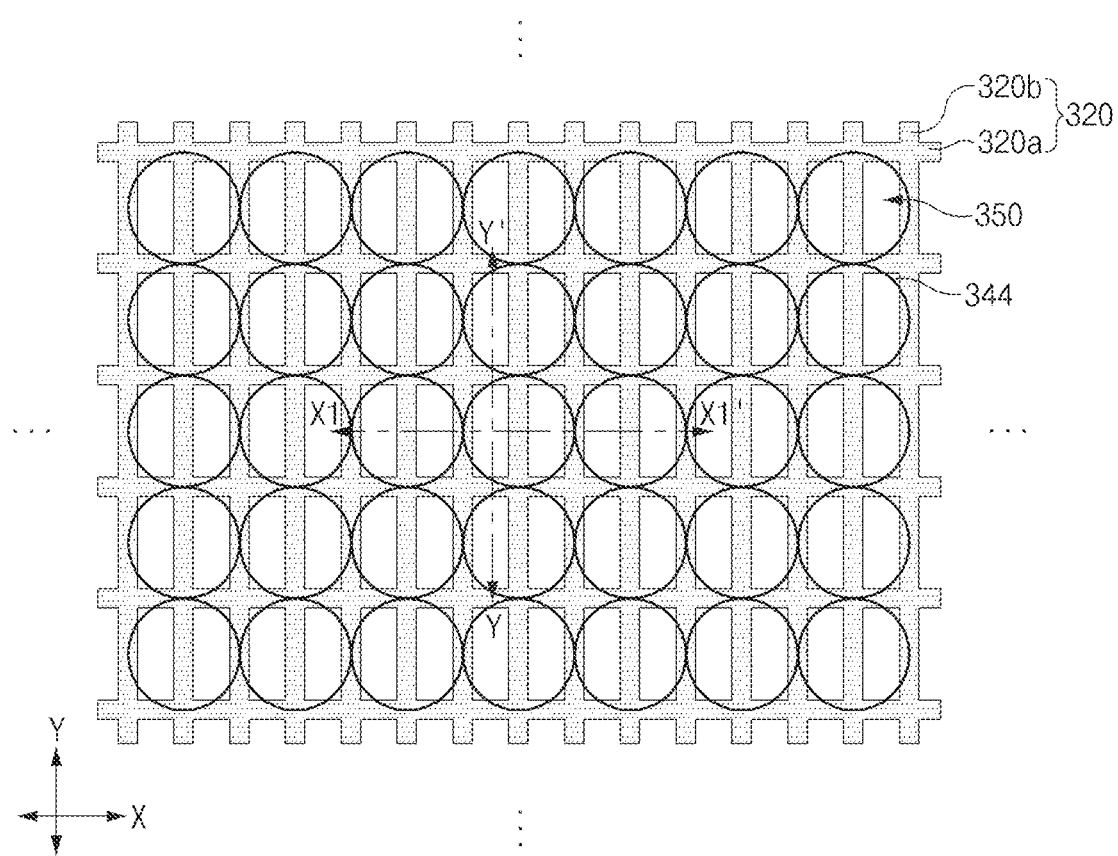
FIG. 2 is a plan view illustrating an example of some regions of a polarization structure formed in a pixel array shown in FIG. 1 based on some implementations of the disclosed technology.
Figure 3A:
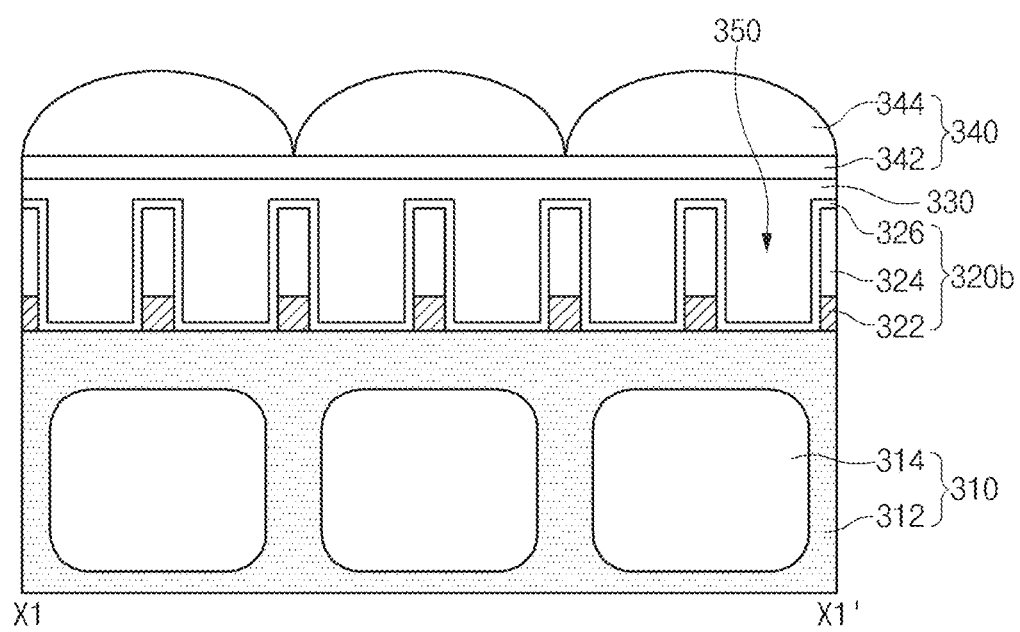
FIG. 3A is a cross-sectional view illustrating an example of the pixel array taken along the line X1-X1' shown in FIG. 2 based on some implementations of the disclosed technology.
Figure 3B:
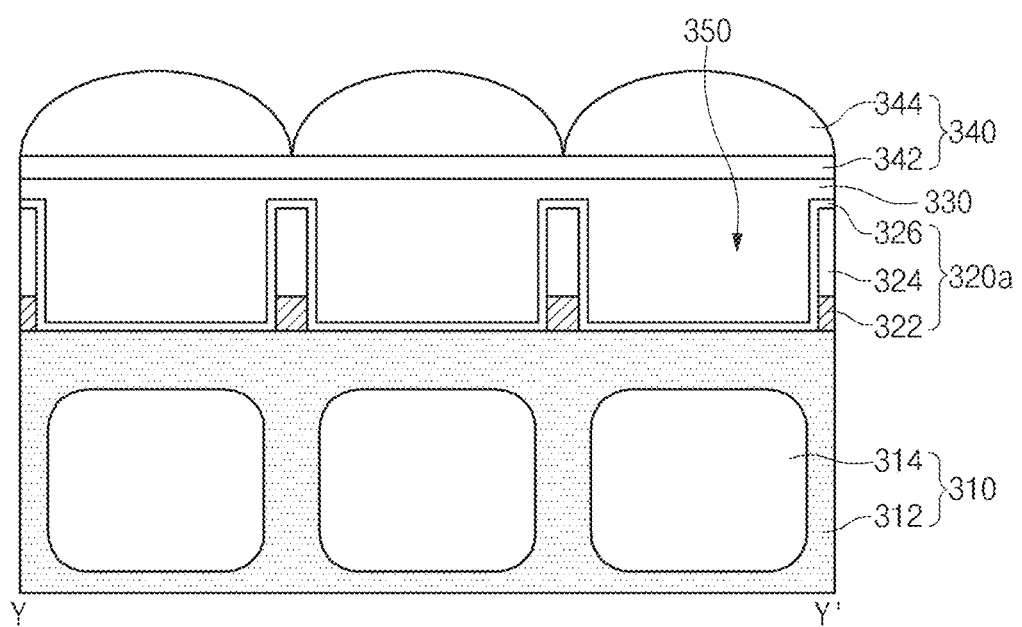
FIG. 3B is a cross-sectional view illustrating an example of the pixel array taken along the line Y-Y' shown in FIG. 2 based on some implementations of the disclosed technology.

FIG. 2 is a plan view illustrating an example of some regions of a polarization structure formed in the pixel array 300 shown in FIG. 1 based on some implementations of the disclosed technology. FIG. 3A is a cross-sectional view illustrating an example of the pixel array taken along the line X1-X1' shown in FIG. 2 based on some implementations of the disclosed technology. FIG. 3B is a cross-sectional view illustrating an example of the pixel array taken along the line Y-Y' shown in FIG. 2 based on some implementations of the disclosed technology.

Referring to FIGS. 2, 3A, and 3B, the pixel array 300 may include a substrate layer 310, a polarization structure 320, a planarization layer 330, and a lens layer 340.

The substrate layer 310 may include a substrate 312 and a photoelectric conversion element 314 formed in the substrate 312.

The substrate 312 may include a semiconductor substrate that includes a first surface and a second surface opposite to the first surface. The polarization structure 320, the planarization layer 330, and the lens layer 340 are disposed near the first surface instead of the second surface. The semiconductor substrate 312 may be in a monocrystalline state, and may include a silicon-containing material. For example, the semiconductor substrate 312 may include a monocrystalline silicon-containing material.

The photoelectric conversion element 314 may generate photocharges by performing photoelectric conversion of incident light received through the first surface. For example, the photoelectric conversion element 314 may generate a pair of an electron and a hole in response to incident light received through the first surface. The photoelectric conversion element 314 may include a stacked structure in which different types of impurity regions are vertically stacked. For example, the photoelectric conversion element 314 may include a photodiode (PD) in which an N-type impurity region and a P-type impurity region are vertically stacked.

The polarization structure 320 may be formed at the first surface of the substrate 312 and between the substrate 312 and the lens layer 340. The polarization structure 320 may receive light which passes the lens layer and selectively transmit the received light based on the light polarization such that only polarized light having a specific direction can pass through the polarization structure 320 and reach the underlying photoelectric conversion element 314. When light emitted from the light source 100 is reflected from the target object 1, the reflected light may include light emitted from the light source 100 and undesired light from other sources such ambient light and other light sources including polarization components (e.g., noise) caused by external light. Therefore, from among incident light applied to the image sensing device, the polarization structure 320 may transmit only specific light having the same polarization components as the light emitted from the target object 1, and may block the remaining polarization components (e.g., noise) other than the specific light. In implementations, the polarization structure 320 may be designed to include a periodic polarization structure over the array of the underlying photoelectric conversion elements 314, respectively. As illustrated by specific examples below, wire-like structures or wires with a metal material and an air gap layer are used to form the polarization structure 320 to perform the polarization selection of incident light to the photoelectric conversion elements 314. This use of the built-in polarization structure 320 in the unit pixels of the imaging pixel array 300 can be used to improve the sensing operation.

The polarization structure 320 may be formed in a grid structure (or a lattice structure) that defines rectangular slit regions 350. For example, the polarization structure 320 may be formed in a wire-grid shape in which a plurality of first wires 320a extending in a first direction (i.e., X-axis direction) and a plurality of second wires 320b extending in a second direction (i.e., Y-axis direction) are interconnected in a grid (or lattice) shape. The slit regions 350 correspond to areas in which the first wires 320a and the second wires 320b are absent and thus the light can pass through the slit regions 350.

The first wires 320a may be consecutively arranged in the second direction at intervals of a predetermined distance, and the second wires 320b may be consecutively arranged in the first direction at intervals of a predetermined distance. Two adjacent first wires 320a are separated from each other by a first distance that may correspond to the length of the unit pixels (PXs) in the second direction. For example, the first wires 320a may be disposed at boundary regions of the unit pixels (PXs) that are spaced apart in the second direction. The two adjacent second wires 320b are disposed in the first direction by a second distance that is shorter than the length of the unit pixels (PXs) in the first direction. For example, the second wires 320b may be disposed at boundary regions of the unit pixels (PXs) that are spaced apart in the first direction and the second wires 320b may be additionally disposed between the boundary regions. Referring to FIG. 2, the first wires 320a and the second wires 320b are disposed to surround boundary regions of each unit pixel and the second wire 320b is also disposed around a middle area of each unit pixel.

The grid structure of the polarization structure 320 allows light to pass through via the slit regions 350 while blocking light in other regions. Each of the slit regions 350 through which incident light passes may be formed in a rectangular shape in which the Y-directional length is longer than the X-directional length. In some implementations, the polarization structure 320 may select only specific light having Y-directional polarization components from among total incident light, and may allow the specific light to pass therethrough. In some implementations, a long-axis length (i.e., a longitudinal length) of the slit region 350 may correspond to the length of the unit pixel (PX) in the second direction, and a short-axis length of the slit region 350 may be shorter than the length of the unit pixel (PX) in the first direction. The slit region 350 may be filled with the one or more same materials as those of the planarization layer 330.

In some implementations, the polarization structure 320 may be formed in a grid shape with wire structures including a spaced filled with a lower index material such as air to form an air layer. The wire structure can be configured to include one or more air layers. For example, the polarization structure 320 may include a metal layer 322, an air or low-index layer 324, and a capping film 326 with an index higher than that of the air or low-index layer 324.

The metal layer 322 may be formed above the photoelectric conversion element 314 over the first surface of the substrate 312. In some implementations, the metal layer may include tungsten (W). The air layer 324 may be formed over the metal layer 322. The capping film 326 may be or include a material film formed at the outermost part of the polarization structure 320, and may cap or cover the metal layer 322 and the air layer 324. The capping film 326 may be formed to extend to the slit region 350. For example, the slit region 350 may include materials of the planarization layer 330 and materials of the capping film 326. The capping film 326 may include an ultra low temperature oxide (ULTO) film such as a silicon oxide film ($SiO_2$).

FIGS. 3A and 3B illustrate an exemplary case in which the polarization structure 320 includes a stacked structure of the metal layer 322 and the air layer 324. In some implementations, the metal layer 322 can be omitted and thus the polarization structure 320 may not include the metal layer 322. For example, the polarization structure 320 may include the air layer 324 and the capping film 326 covering the air layer 324 without including the metal layer 322.

In implementations where a polarizer is formed in a grid structure, a distance between grids of the polarizer (or a period of the polarizer) can be set to be shorter than one wavelength of incident light, e.g., 1/10 of a wavelength of incident light. For example, if a wavelength of incident light (IR) is set to 1000 nm and the polarizer formed in the grid structure can be designed to have a period of the polarizer to be shorter than 100 nm (=1000 nm/10).

In consideration of a refractive index of constituent materials of the polarizer, the polarization space (or period) might be further reduced or shortened. For example, assuming that the refractive index of the polarizer is set to 2, the polarizer period needs to be set to 50 nm (=100 nm/2). If the polarizer period is reduced as described above, a fabrication process for forming the polarizer may be complicated, and the amount of light passing through (penetrating) the polarizer may be reduced, resulting in reduction of light efficiency.

Some implementations of the disclosed technology may reduce the refractive index of the polarization structure 320 by applying air to the polarization structure 320. As a result, although the polarization structure 320 is formed in the grid structure, the grid-shaped polarization structure 320 can have a relatively larger space between grids as compared to polarization elements having the grid structure in which air is not applied. Therefore, the fabrication process for forming the polarization structure 320 can be simplified and easier, and the amount of incident light applied to the photoelectric conversion element 314 after passing through the polarization structure 320 can increase, which results in improvements in light efficiency.

The planarization layer 330 may be formed over the polarization structure 320 and in the slit region 350 defined by the polarization structure 320, such that a step difference caused by the polarization structure 320 can be removed. The planarization layer 330 may serve as an anti-reflection film that allows incident light received through the lens layer 340 to pass through the photoelectric conversion element 314. The planarization layer 330 may be formed of or include a light transmission material such as $SiO_2$ or SiN.

The lens layer 340 may allow incident light to converge upon the corresponding photoelectric conversion element 314. The lens layer 340 may include an anti-reflection film 342 and a microlens 344. The microlens 344 may be formed per unit pixel PX.

Figure 4:
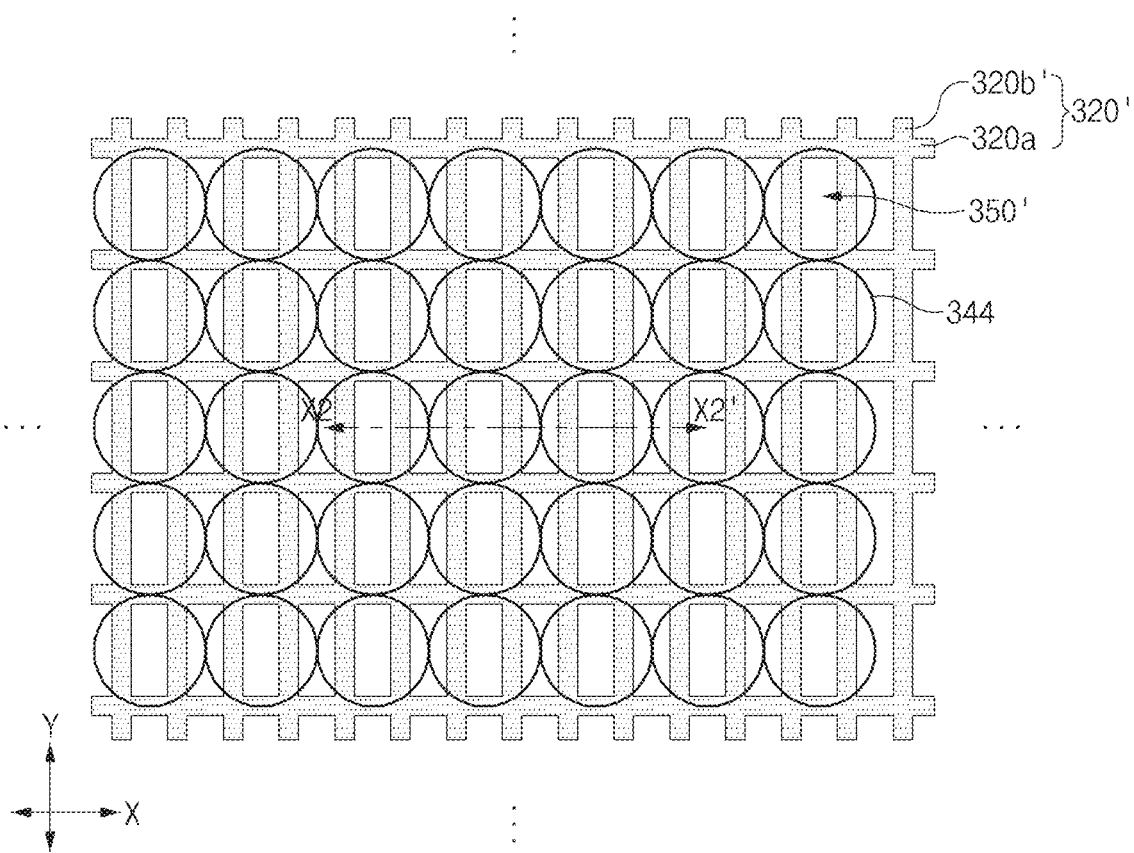
FIG. 4 is a plan view illustrating an example of some regions of a polarization structure formed in the pixel array shown in FIG. 1 based on some implementations of the disclosed technology.
Figure 5:
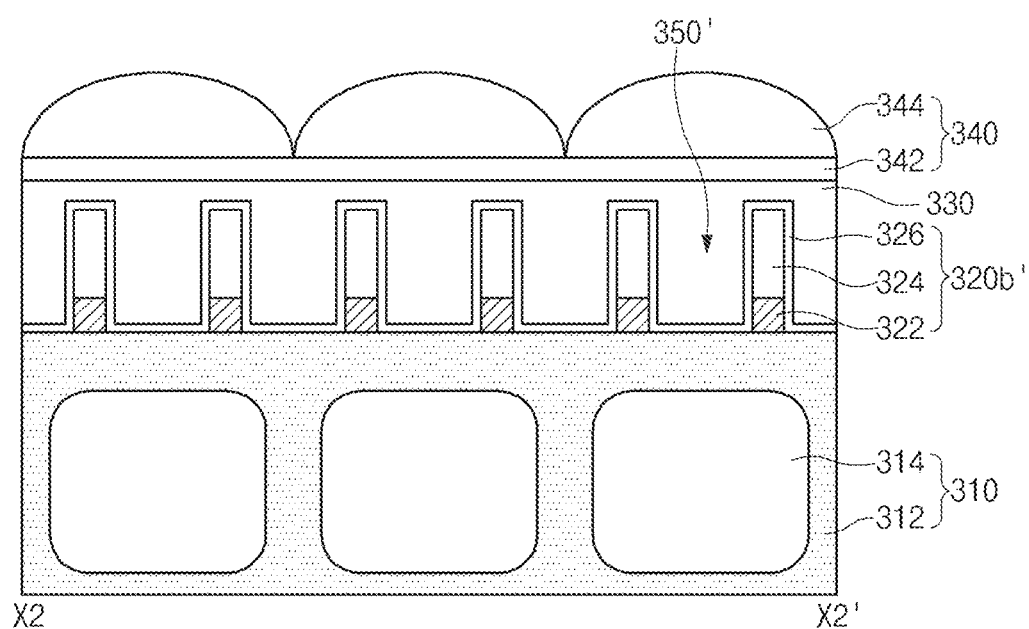
FIG. 5 is a cross-sectional view illustrating an example of the pixel array taken along the line X2-X2' shown in FIG. 4 based on some implementations of the disclosed technology.

FIG. 4 is a plan view illustrating an example of some regions of the polarization structure formed in the pixel array shown in FIG. 1 based on some implementations of the disclosed technology. FIG. 5 is a cross-sectional view illustrating an example of appearance of the pixel array taken along the line X2-X2' shown in FIG. 4 based on some implementations of the disclosed technology.

Referring to FIGS. 4 and 5, a polarization structure 320' may be formed in a grid structure (or a lattice structure) that defines rectangular slit regions 350' in form of an array in the pixel array. For example, the polarization structure 320' may be formed in a grid shape in which a plurality of first wires 320a extending in a first direction (i.e., X-axis direction) and a plurality of second wires 320b' extending in a second direction (i.e., Y-axis direction) are interconnected in a grid (or lattice) shape.

The first wires 320a may be consecutively arranged in the second direction at intervals of a predetermined distance, and the second wires 320b' may be consecutively arranged in the first direction at intervals of a predetermined distance.

In this case, the first wires 320a may be disposed at boundary regions of the unit pixels (PXs) that are spaced apart in the second direction. In comparison with the second wires 320b shown in FIG. 2, while the second wires 320b' of FIG. 4 are disposed by a same space (or period) as that shown in FIG. 2, the formation position of the second wires 320b' shown in FIG. 4 may be different from that of the second wires 320b shown in FIG. 2. For example, the second wires 320b' may be disposed inside the boundary regions of the unit pixels (PXs). In the implementation shown in FIG. 4, the second wires 320b' may be disposed in a region disposed between the boundary regions. The region in which the second wires 320b' are disposed are located inside of each unit pixel (PX) and are not located at boundary regions of the unit pixel (PXs).

With the second wires 320b' that are located differently from those as shown in FIG. 2, the slit region 350' through which incident light passes is also located differently from the slit region 350 shown in FIG. 2. Although the slit regions 350' in FIG. 4 is disposed at different positions of each unit pixel (PX), the slit region 350' shown in FIGS. 4 and 5 may have an identical size to that of the slit region 350 shown in FIG. 2.

In the implementation as shown in FIGS. 4 and 5, the polarization structure 320' may be formed in a grid shape with wire structures including the air layer. The polarization structure 320' may be identical in structure to the polarization structure 320 shown in FIG. 2.

The image sensing device according to the embodiments of the disclosed technology includes a polarization structure that allows a selected incident light of a polarization to reach to the photoelectric conversion elements of the image sensing device, thereby minimizing noises caused by external light.

Those skilled in the art will appreciate that the embodiments may be carried out in other ways than those set forth herein Although a number of illustrative embodiments have been described, it should be understood that numerous other modifications and embodiments can be devised based on what is disclosed and/or illustrated.

What is claimed is:

1. An image sensing device, comprising:
a semiconductor substrate configured to include photoelectric conversion elements that generate photocharges in response to light incident to the photoelectric conversion element;
a plurality of microlenses disposed over the semiconductor substrate and configured to allow the incident light to converge upon the photoelectric conversion elements; and
a polarization structure disposed between the semiconductor substrate and the microlenses and configured to transmit light of a polarization oriented in a specific direction to the photoelectric conversion elements,
wherein the polarization structure includes wires including an air layer, wherein the wires include:
a plurality of first wires extending in a first direction and disposed in a second direction perpendicular to the first direction at intervals of a first distance; and
a plurality of second wires extending in the second direction and disposed in the first direction at intervals of a second distance, the plurality of the second wires coupled to the plurality of first wires.

2. The image sensing device according to claim 1, wherein the polarization structure has a grid shape that defines a slit region through which a portion of the incident light passes.

3. The image sensing device according to claim 1, wherein the first distance is longer than the second distance.

4. The image sensing device according to claim 1, wherein the first wires are disposed in first boundary regions of the microlenses adjacent to each other in the second direction.

5. The image sensing device according to claim 1, wherein the second wires are disposed in second boundary regions of the microlenses adjacent to each other in the first direction, and are also disposed between the second boundary regions.

6. The image sensing device according to claim 1, wherein the second wires are not disposed in second boundary regions of the microlenses adjacent to each other in the first direction, and are disposed between the second boundary regions.

7. The image sensing device according to claim 1, wherein the polarization structure further includes a capping material formed to cover the one or more air layers.

8. The image sensing device according to claim 7, wherein the capping material is formed to extend to one or more slit regions defined by the polarization structure.

9. The image sensing device according to claim 7, wherein the polarization structure further includes:
a metal layer disposed under the one or more air layers.

10. An image sensing device comprising:
a pixel array in which a plurality of unit pixels are arranged in a first direction and a second direction perpendicular to the first direction and configured to output a pixel signal corresponding to photocharges generated in response to incident light,
wherein the pixel array includes:
a photoelectric conversion element configured to generate the photocharges in response to the incident light; and
a polarization structure disposed over the photoelectric conversion element, and configured to transmit a polarized light oriented in a specific direction among the incident light to the photoelectric conversion element,
wherein the polarization structure includes one or more air layers,
wherein the polarization structure includes:
a plurality of first wires extending in the first direction, and disposed in the second direction at intervals of a first period; and
a plurality of second wires extending in the second direction and disposed in the first direction at intervals of a second period shorter than the first period, the plurality of second wires being coupled to the plurality of first wires.

11. The image sensing device according to claim 10, wherein the polarization structure further includes:
a capping material formed to cover the one or more air layers.

12. The image sensing device according to claim 10, wherein the polarization structure further includes:
a metal layer disposed between the one or more air layers and a substrate.

13. The image sensing device according to claim 10, wherein the polarization structure has a grid shape that defines a slit region through which a portion of the incident light passes.

14. The image sensing device according to claim 10, wherein the first wires are disposed in boundary regions of the unit pixels.

15. The image sensing device according to claim 10, wherein the second wires are disposed in boundary regions of the unit pixels and between the boundary regions of the unit pixels.

16. The image sensing device according to claim 10, wherein the second wires are not disposed in boundary regions of the unit pixels, and are disposed between the boundary regions of the unit pixels.

17. An image sensing device, comprising:
a semiconductor substrate configured to include a photoelectric conversion element that generates photocharges in response to light incident to the photoelectric conversion element;
a plurality of microlenses disposed over the semiconductor substrate and configured to allow the incident light to converge upon the photoelectric conversion element; and
a polarization structure disposed between the semiconductor substrate and the microlenses and configured to transmit light of a polarization oriented in a specific direction to the photoelectric conversion element,
wherein the polarization structure includes one or more air layers, and
wherein the image sensing device further comprises:
a planarization layer formed over the polarization structure and under the plurality of microlenses.

18. The image sensing device according to claim 17, wherein the polarization structure has a grid shape that defines a slit region through which a portion of the incident light passes.

* * * * *